(12) United States Patent
Brintzinger

(10) Patent No.: US 6,911,390 B2
(45) Date of Patent: Jun. 28, 2005

(54) FABRICATION METHOD FOR AN INTERCONNECT ON A SUBSTRATE

(75) Inventor: Axel Brintzinger, Dresden (DE)

(73) Assignee: Infineon Technologies AG, Munich (DE)

( * ) Notice: Subject to any disclaimer, the term of this patent is extended or adjusted under 35 U.S.C. 154(b) by 251 days.

(21) Appl. No.: 10/292,621

(22) Filed: Nov. 13, 2002

(65) Prior Publication Data

US 2003/0092274 A1 May 15, 2003

(30) Foreign Application Priority Data

Nov. 15, 2001 (DE) .......................................... 101 56 054

(51) Int. Cl.$^7$ .......................................... H01L 21/4763
(52) U.S. Cl. ...................... 438/637; 438/613; 438/638; 438/745
(58) Field of Search ................................ 438/613, 614, 438/616, 617, 624, 637, 638, 745, 751, 754; 216/100, 101, 108

(56) References Cited

U.S. PATENT DOCUMENTS

| 4,861,425 | A | * | 8/1989 | Greer et al. ................. 438/615 |
| 5,427,983 | A | | 6/1995 | Ahmad et al. |
| 5,656,525 | A | * | 8/1997 | Lin et al. ....................... 216/11 |
| 6,413,851 | B1 | * | 7/2002 | Chow et al. ................. 438/613 |
| 6,441,473 | B1 | * | 8/2002 | Deshmukh ................... 257/669 |

* cited by examiner

*Primary Examiner*—Lan Vinh
(74) *Attorney, Agent, or Firm*—Greenblum & Bernstein, P.L.C.

(57) ABSTRACT

Method for fabricating an interconnect on a substrate. The method includes applying a mask on the substrate, patterning the mask, so that it has an opening corresponding to the interconnect, providing the interconnect in the opening on the substrate, widening the opening in order to uncover a region laterally adjoining the interconnect, encapsulating of interconnect in the widened opening, andremoving the mask.

24 Claims, 4 Drawing Sheets

FABRICATION METHOD FOR AN INTERCONNECT ON A SUBSTRATE

CROSS-REFERENCE TO RELATED APPLICATION

The present application claims priority under 35 U.S.C. § 119 of German Patent Application No. 101 56 054.0, filed on Nov. 15, 2001, the disclosure of which is expressly incorporated by reference herein in its entirety.

BACKGROUND OF THE INVENTION

The present invention relates to a fabrication method for an interconnect on a semiconductor substrate.

DESCRIPTION OF BACKGROUND INFORMATION

With the advent of the technology of wafer level packaging (WLP), wafer level test (WLT) and wafer level burn-in (WLBI), it has become necessary to equip semiconductor substrates or semiconductor chips with electrically connecting elements which have a built-in compliance (flexibility) in the direction of the X, Y and Z axes.

A further requirement is that it is necessary to provide a stable electrical connection from the semiconductor to the printed circuit board. In the case of a copper interconnect, the metal must be protected against oxidation and corrosion. This is usually realized by encapsulating the copper with another, more resistant metal such as nickel.

The disadvantage of such protection is that an additional photolithographic stage has hitherto been required in fabrication. This makes the process more costly and more complex.

FIG. 8 shows the cross section of a semiconductor substrate 1 provided with an interconnect according to a customary method. A layer 2 made of a titanium compound, which serves both as a diffusion barrier and as a short-circuit layer for all subsequent coating steps, is applied to the substrate 1 by the sputtering method. Above it, it is adjoined by a copper carrier layer 3, which is applied by the sputtering method and is required in order to enable a subsequent coating with a copper interconnect 4. A photolithographically patterned mask 7 made of photoresist that can be electrodeposited determines the width of the interconnect. A nickel layer 5 is applied above the copper interconnect 4. Above said nickel layer, the latter is adjoined by a gold layer 6, which is required for wetting with solder since adequate wetting of the surface with solder does not take place on nickel. The nickel layer 5 serves as a diffusion barrier between the copper layer 4 and the gold layer 6, since the gold would otherwise diffuse completely into the copper.

FIG. 9 shows the arrangement after the removal of the mask 7 made of the photoresist that can be electrodeposited. The sidewalls 8 of the copper interconnect 4 are uncovered and thus exposed to corrosion.

FIG. 10 shows the arrangement after the structure etching of the copper carrier layer 3 and after the structure etching of the layer 2 made of the titanium compound. The sidewalls 8 of the copper interconnect 4 and of the copper carrier layer 3 are uncovered and can corrode. An undercut 9 can impair the strength of this interconnect arrangement on the substrate 1.

In the case of the non-compliant (-flexible) wafer level packages (WLP) (e.g. flip-chip), a corrosion protection for the copper constituents of this interconnect arrangement can be applied by reliquefying solder which is applied to the metal interconnect arrangement from above (underbump metallurgy UBM). This reliquefaction allows the solder (SnPb) to flow over the edges of the copper and to encapsulate the copper in the process. Other methods utilize a further photolithographic step and encapsulate the metal either with a dielectric, such as e.g. benzocyclobutene (BCB), or other corrosion-resistant materials.

In the case of the compliant (flexible) wafer level packages (WLP), no encapsulation method has been disclosed heretofore.

Reliquefying the solder in order thereby to encapsulate the copper requires a high outlay and is very cost-intensive. The use of an additional photolithographic step in order to ensure encapsulation of the metal is likewise associated with a high outlay and high costs.

SUMMARY OF THE INVENTION

It is an object of the present invention to provide a fabrication method for an interconnect on a substrate which, in particular, can ensure a corrosion protection of corrosive materials, such as e.g. copper, also in the field of wafer level packaging (WLP).

According to the invention, this object is achieved by the fabrication method for an interconnect on a substrate which is specified in claim 1.

The idea on which the present invention is based consists in processing a photoresist layer that has already been applied and patterned, in order to widen the structure openings in the photoresist, so that a subsequent deposition process (coating) can encapsulate an interconnect located in the widened opening.

In the present invention, the problem mentioned in the introduction is solved in particular by virtue of the fact that corrosive layers, for example made of copper, are encapsulated by a non-corrosive material, in particular a corrosion-resistant metal, without this requiring an additional photolithographic step. The photoresist is exposed to an etching process only for a short time, as a result of which the structure widths of the openings in the photoresist are enlarged, and a subsequent coating with a material which is corrosion-resistant is thus permitted to enclose the underlying layer. Consequently, only one photolithographic step is used.

In accordance with one preferred development, the widening of the opening in the mask in order to uncover the region laterally adjoining the interconnect is effected by an isotropic etching process, in particular a wet etching process, during which a predetermined thickness of the photoresist layer is removed.

In accordance with a further preferred development, a hydroxide solution, in particular sodium hydroxide solution, is used during the etching process for widening the opening in the mask.

In accordance with a further preferred development, the photoresist is deposited by an electrochemical deposition process.

Other exemplary embodiments and advantages of the present invention may be ascertained by reviewing the present disclosure and the accompanying drawings.

BRIEF DESCRIPTION OF THE DRAWINGS

The present invention is further described in the detailed description which follows, in reference to the noted plurality of drawings by way of non-limiting examples of certain embodiments of the present invention, in which like numerals represent like elements throughout the several views of the drawings, and wherein.

DETAILED DESCRIPTION OF THE PRESENT INVENTION

The particulars shown herein are by way of example and for purposes of illustrative discussion of the embodiments of the present invention only and are presented in the cause of providing what is believed to be the most useful and readily understood description of the principles and conceptual aspects of the present invention. In this regard, no attempt is made to show structural details of the present invention in more detail than is necessary for the fundamental understanding of the present invention, the description taken with the drawings making apparent to those skilled in the art how the several forms of the present invention may be embodied in practice.

Figure 1:
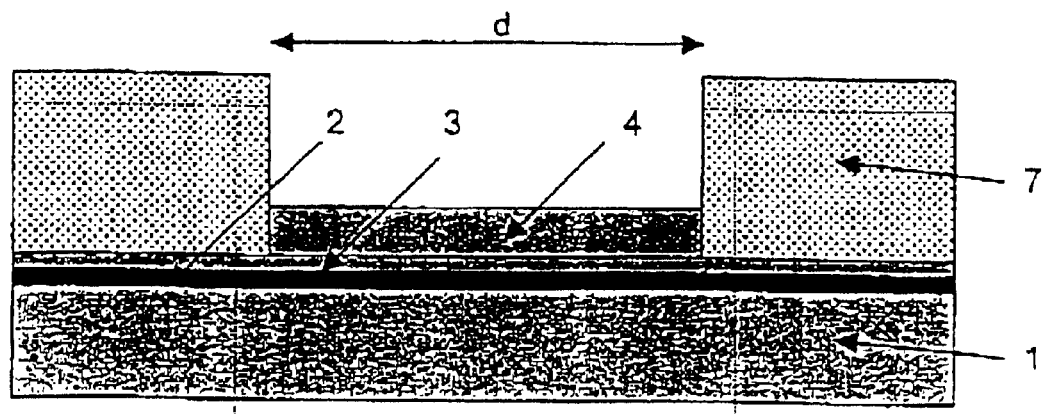
FIG. 1 shows the cross section of an arrangement for elucidating an embodiment of the invention after elementary steps in the fabrication process.

Referring to the drawings wherein like characters represent like elements, FIG. 1 shows the cross section of an arrangement for elucidating an embodiment of the present invention. In conjunction with the subsequent FIGS. 2 to 7, FIG. 1 represents a starting point in the fabrication method in accordance with the present embodiment.

In accordance with FIG. 1, a titanium compound (Ti/TiN or Ti/TiW) in a layer 2 has been sputtered onto a semiconductor substrate 1. The layer 2 made of the titanium compound serves as a diffusion barrier and likewise as a short-circuit layer in order to enable subsequent coatings which are intended to be applied electrochemically. After the application of the layer 2 made of the titanium compound, a copper carrier layer 3 is likewise applied by the sputtering method. Said copper carrier layer 3 is required in order to enable a subsequent electrical copper coating. A photoresist layer applied in an electrical deposition process has been patterned in a photolithographic process and serves as mask resist with a mask opening of width d for the copper coating. The copper coating thus produces an interconnect 4 which likewise has the width of the mask opening d.

Figure 2:
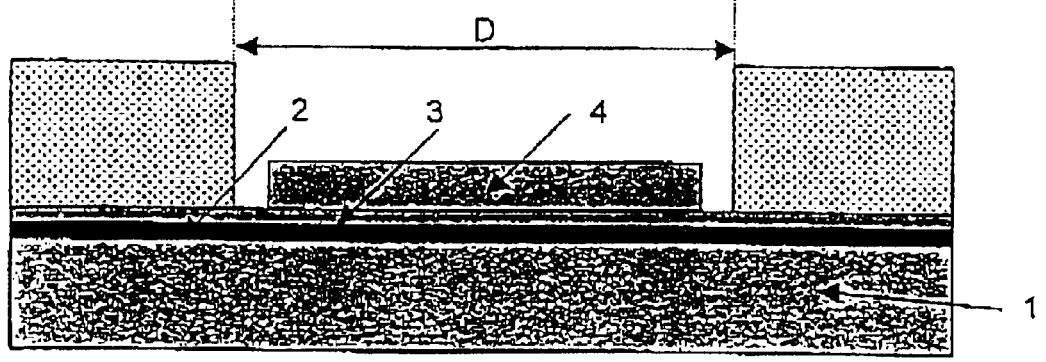
FIG. 2 shows the cross section of the arrangement after the method stage of widening the opening in the photoresist.

FIG. 2 shows the cross section of the arrangement after an isotropic etching process of the photoresist of the mask 7. To that end, the electrophoretic photoresist (resist) is brought into contact for a short time (e.g. 2 min) with sodium hydroxide solution (NaOH), which also serves as a stripper for removing the mask, which leads to an essentially uniform reduction of the thickness of the photoresist mask 7 by about 1 $\mu$m, as indicated by a broken line in FIGS. 1 and 2. As a result of this etching process, the photoresist layer 7 is reduced by this thickness at all surfaces which come into contact with the sodium hydroxide solution (NaOH). This results in a widening of the mask opening from the width d to the width D.

Figure 3:
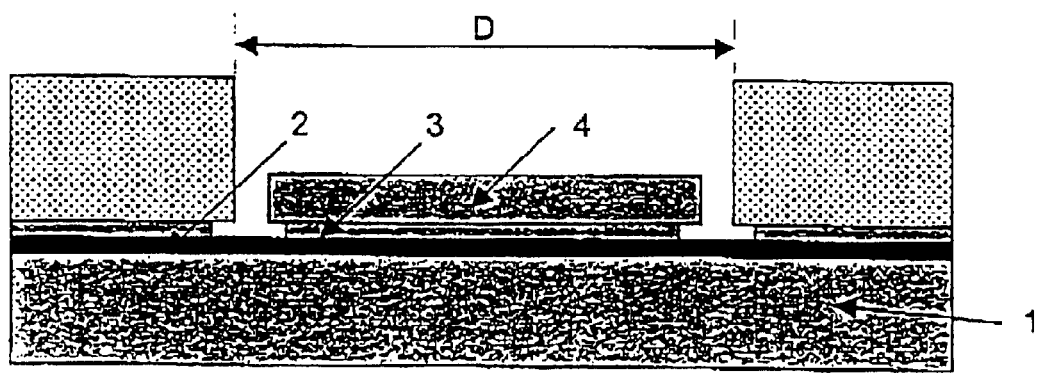
FIG. 3 shows the cross section of the arrangement after the method step of carrier layer etching.

FIG. 3 illustrates the cross section of the arrangement after a further etching process, during which the copper carrier layer 3 is removed in the widened opening. Not only the copper carrier layer 3, as desired for the patterning, but also the overlying copper coating 4 is attacked in this etching process. However, since the thickness of the copper carrier layer 3, with 150 nm, for example, is at least one order of magnitude smaller than the thickness of the copper coating 4, which is 2 000 nm, for example, the reduction of the layer thickness of the copper coating 4 can be accepted as tenable.

Figure 4:
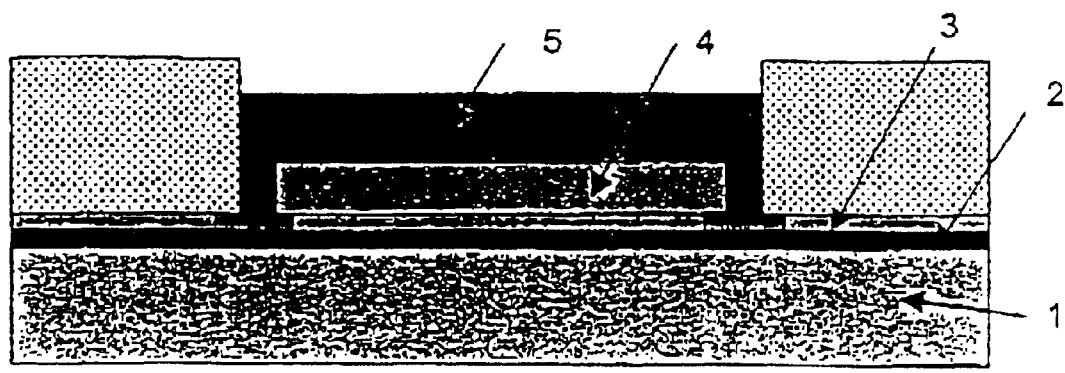
FIG. 4 shows the cross section of the arrangement after a first coating step.

FIG. 4 shows the cross section of the arrangement after a coating with a non-corrosive material such as e.g. nickel 5, which encapsulates the layers made of corrosive copper 3, 4.

Figure 5:
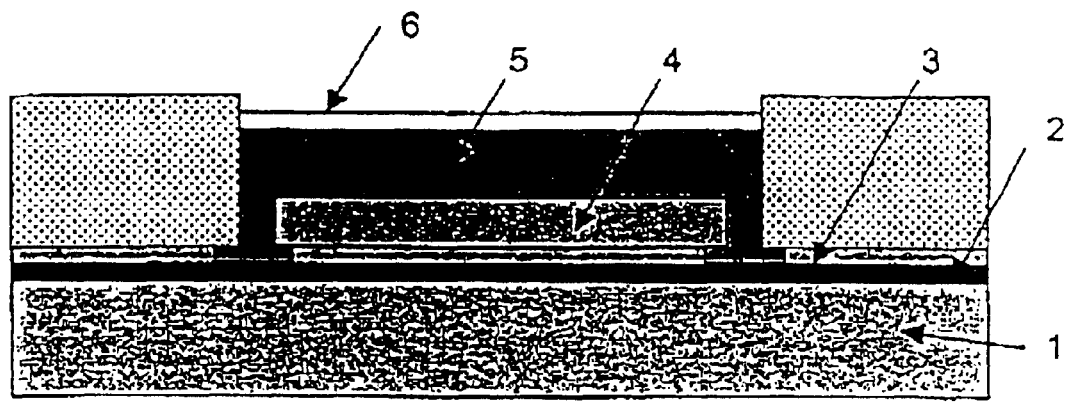
FIG. 5 shows the cross section of the arrangement after a further coating step.

FIG. 5 shows a cross section of the arrangement after the application of a gold layer 6 on the structure in accordance with FIG. 4. This gold layer 6 is required in order later to enable a wetting with solder (e.g. SnPb), since such a wetting with solder is not ensured satisfactorily on nickel. The corrosion-resistant gold coating 6 must be separated from the copper coating 4 by the nickel layer 5, which serves as a diffusion barrier, since the gold coating 6 would otherwise diffuse completely into the copper layer 4 and the copper carrier layer 3.

Figure 6:
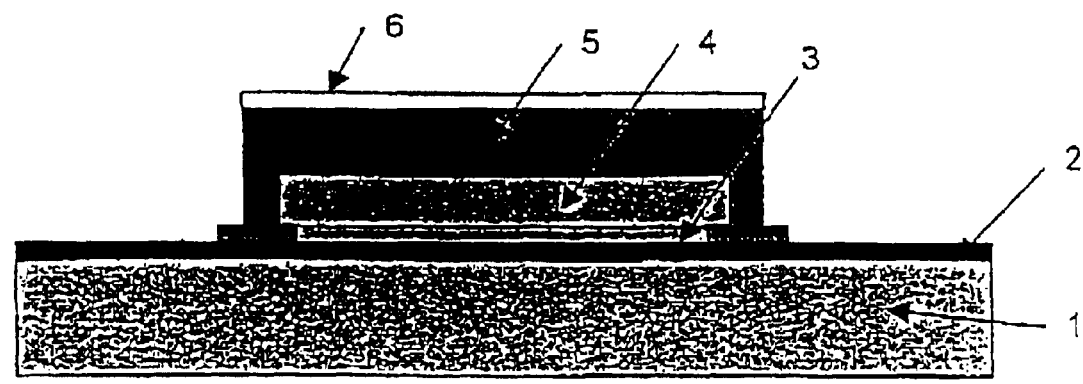
FIG. 6 shows the cross section of the arrangement after the removal of the mask made of photoresist and a carrier layer etching process.

FIG. 6 illustrates a cross section of the arrangement after the complete removal of the photoresist layer 7 and a further etching process, during which the carrier base layer which is not encapsulated is removed.

Figure 7:
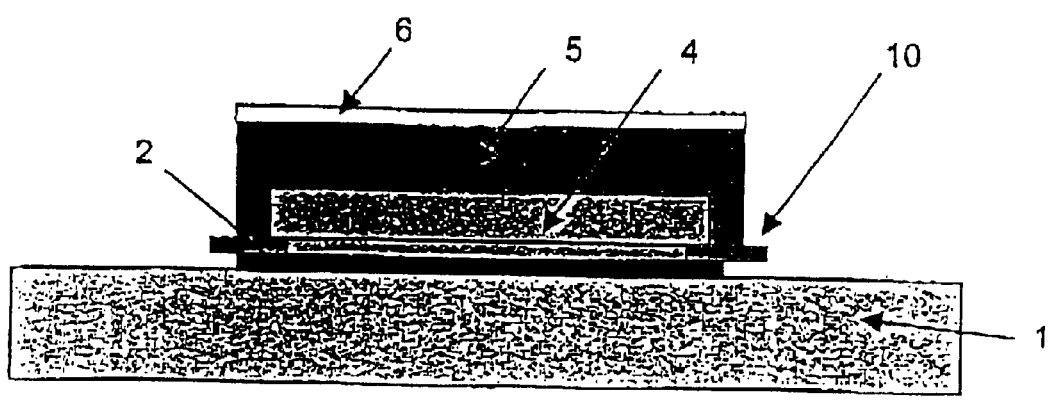
FIG. 7 shows the cross section of the arrangement after a concluding etching process of a diffusion barrier situated on the substrate.
Figure 8:
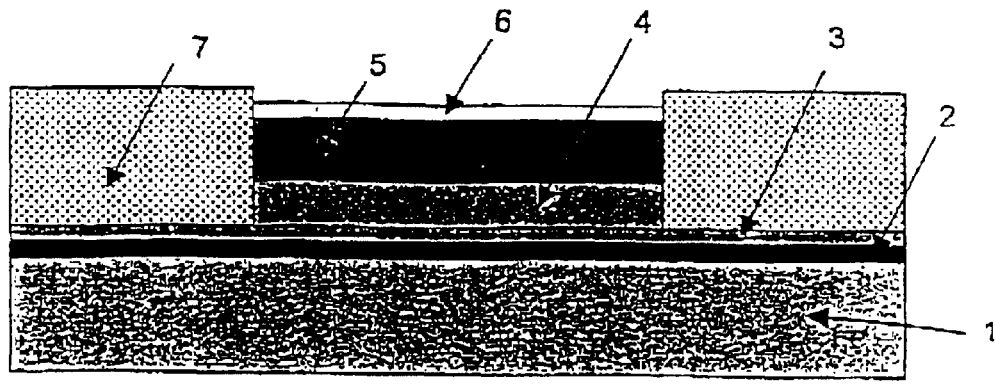
FIG. 8 shows the cross section of a customary arrangement for elucidating a customary method after elementary steps in the fabrication method.
Figure 9:
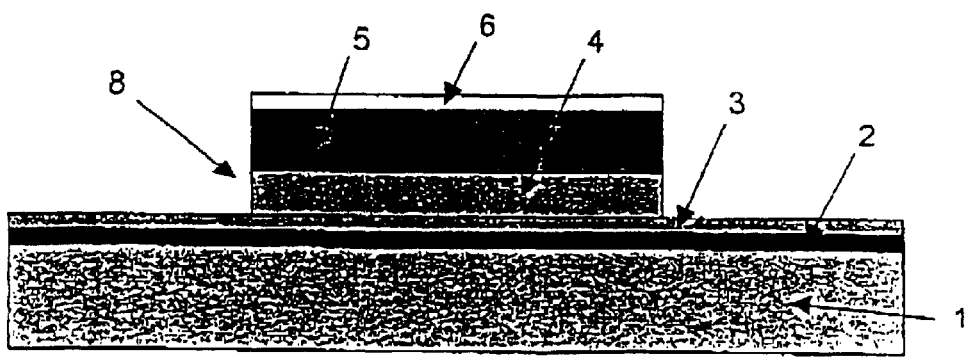
FIG. 9 shows the cross section of the customary arrangement after the method step of removing the mask made of photoresist.
Figure 10:
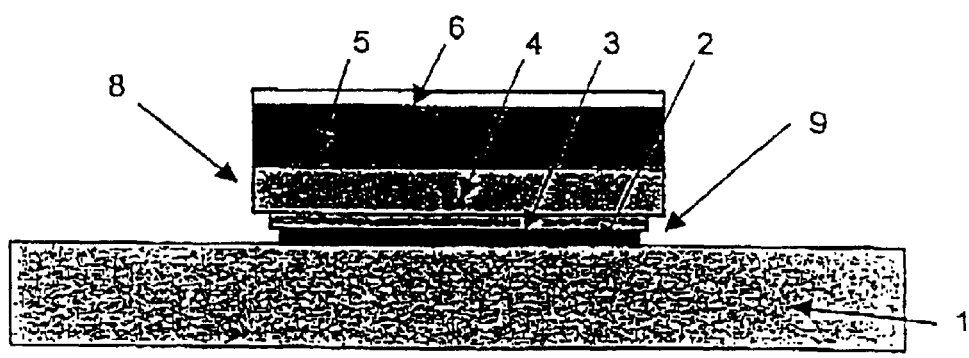
FIG. 10 shows the cross section of the customary arrangement after two further etching processes in the fabrication method.

FIG. 7 shows a cross section of the arrangement after a further etching process, in which the layer 2 made of a titanium compound which serves as short-circuit layer and diffusion barrier is removed in uncovered regions and with a slight undercut. The nickel layer 5 has encapsulated the copper layers 4, 3 and consequently protected them against corrosion, and can thus also prevent, in particular, an undercut of the copper layers 3, 4.

Although the present invention has been described above using a preferred exemplary embodiment, it is not restricted thereto, but rather can be modified in diverse ways.

It is possible, of course, to use other layer materials or to provide additional interconnect layers.

It is noted that the foregoing examples have been provided merely for the purpose of explanation and are in no way to be construed as limiting of the present invention. While the present invention has been described with reference to certain embodiments, it is understood that the words which have been used herein are words of description and illustration, rather than words of limitation. Changes may be made, within the purview of the appended claims, as presently stated and as amended, without departing from the scope and spirit of the present invention in its aspects. Although the present invention has been described herein with reference to particular means, materials and embodiments, the present invention is not intended to be limited to the particulars disclosed herein; rather, the present invention extends to all functionally equivalent structures, methods and uses, such as are within the scope of the appended claims.

What is claimed is:

1. A method for fabricating an interconnect on a substrate comprising:
applying a mask on the substrate;
patterning the mask, so that it has an opening corresponding to the interconnect;
providing the interconnect in the opening on the substrate;
widening the opening in order to uncover a region laterally adjoining the interconnect along the entire vertical extension of the interconnect;
encapsulating of the interconnect in the widened opening; and
removing the mask.

2. The method according to claim 1, further comprising:
applying at least one of a diffusion barrier and a short-circuit layer on the substrate, before said applying of the mask.

3. The method according to claim 2, wherein the at least one of the diffusion barrier and the short-circuit layer comprises a metal layer.

4. The method according to claim 3, wherein the metal layer contains titanium.

5. The method according to claim 2, further comprising applying a carrier layer to the substrate, before said applying of the mask.

6. The method according to claim 5, wherein said applying of the carrier layer is after said applying the at least one of a diffusion barrier and a short-circuit layer.

7. The method according to claim 6, wherein the carrier layer comprises one of a corrosive metal compound and a corrosive metal.

8. The method according to claim 7, wherein the one of a corrosive metal compound and a corrosive metal contains copper.

9. The method according to claim 1, wherein the interconnect comprises a corrosive metal.

10. The method according to claim 9, wherein the corrosive metal of the interconnect is copper.

11. The method according to claim 1, wherein said applying the mask is by electrical deposition.

12. The method according to claim 1, wherein said patterning of the mask is by a photolithographic process.

13. The method according to claim 1, wherein said widening of the opening in the mask is effected by an etching process.

14. The method according to claim 13, wherein said etching process is effected isotropically.

15. The method according to claim 14, wherein:
said etching includes using a hydroxide solution; and
the mask is a photoresist mask.

16. The method according to claim 1, wherein said encapsulating is effected by depositing a non-corrosive material.

17. The method according to claim 16, wherein the non-corrosive material is metallic.

18. The method according to claim 17, Wherein the non-corrosive material is nickel.

19. The method according to claim 1 further comprising applying an interconnect layer to the interconnect, after said encapsulating.

20. The method according to claim 19, wherein the interconnect layer comprises a non-corrosive metal.

21. The method according to claim 6, further comprising removing the carrier layer by at least one removal etching process, after the removal of the mask.

22. The method according to claim 1, wherein said encapsulating substantially protects against corrosion protection.

23. The method according to claim 15, where the hydroxide solution is sodium hydroxide.

24. The method according to claim 20, wherein the non-corrosive metal of the interconnect layer is gold.

* * * * *

UNITED STATES PATENT AND TRADEMARK OFFICE
CERTIFICATE OF CORRECTION

PATENT NO. : 6,911,390 B2
DATED : June 28, 2005
INVENTOR(S) : A. Brintzinger

It is certified that error appears in the above-identified patent and that said Letters Patent is hereby corrected as shown below:

Title page,
Item [56], References Cited, FOREIGN PATENT DOCUMENTS, add:
-- 11-176860    07/22/99    Japan
   2001-93929    04/06/01    Japan --;
OTHER PUBLICATIONS, add:
-- English Language Abstract of JP 11-176860
English Language Abstract of JP 2001-93929 --.

Column 6,
Line 22, "Wherein" should be -- wherein --.

Signed and Sealed this

Twenty-first Day of February, 2006

JON W. DUDAS
*Director of the United States Patent and Trademark Office*